(12) United States Patent  
Maxwell

(10) Patent No.: US 7,348,785 B2  
(45) Date of Patent: Mar. 25, 2008

(54) METHOD AND APPARATUS FOR MAGNETICALLY ACHIEVING ELECTRICAL CONTINUITY

(76) Inventor: William Wayne Maxwell, 3215 Darnell Dr., Austin, TX (US) 78745

( * ) Notice: Subject to any disclaimer, the term of this patent is extended or adjusted under 35 U.S.C. 154(b) by 107 days.

(21) Appl. No.: 11/157,084

(22) Filed: Jun. 20, 2005

(65) Prior Publication Data

US 2005/0280429 A1    Dec. 22, 2005

Related U.S. Application Data

(60) Provisional application No. 60/581,614, filed on Jun. 21, 2004.

(51) Int. Cl.  
*G01R 31/02* (2006.01)

(52) U.S. Cl. ..................................... 324/754

(58) Field of Classification Search ............. 324/765, 324/158.1, 754, 761–762, 72.5, 133, 149; 439/37–40

See application file for complete search history.

(56) References Cited

U.S. PATENT DOCUMENTS

| | | | | |
|---|---|---|---|---|
| 3,229,030 A | * | 1/1966 | Baermann ............... | 174/117 F |
| 3,750,083 A | * | 7/1973 | Fayling ..................... | 439/39 |
| 3,845,573 A | * | 11/1974 | Kasamatsu ................ | 434/224 |
| 4,296,376 A | * | 10/1981 | Bartol, Jr. ................. | 324/235 |
| 4,481,467 A | * | 11/1984 | Alexandersen et al. ... | 324/72.5 |
| 5,132,607 A | * | 7/1992 | Shah et al. ............... | 324/72.5 |
| 5,401,175 A | * | 3/1995 | Guimond et al. ......... | 439/38 |

* cited by examiner

Primary Examiner—Ha Tran Nguyen  
Assistant Examiner—Tung X. Nguyen  
(74) Attorney, Agent, or Firm—David Allen Hall

(57) ABSTRACT

A method and apparatus for achieving electrical conductivity that can, for instance, obviate the need for the use of two hands to make a measurement of electrical properties across two contacts that do not lend themselves to the acceptance of clip-on leads, or across contacts that are located where access is difficult. Probes constructed partially with ferromagnetic materials and small permanent magnets provide the connectivity and conductivity of the present invention.

14 Claims, 4 Drawing Sheets

METHOD AND APPARATUS FOR MAGNETICALLY ACHIEVING ELECTRICAL CONTINUITY

This application claims priority from provisional application 60/581,614 filed Jun. 21, 2004

FIELD OF THE INVENTION

The present invention pertains to the field of electronics, specifically to the fields of electronic measurement, calibration, and instrumentation.

BACKGROUND OF THE INVENTION

All uses of electricity eventually require voltage measurements. Residential and commercial wiring installations, air conditioning systems, vehicle electrical systems, computer repair, and monitoring of laboratory experiments all require voltage measurements. One type of voltage probe common in the industry is a set of two spikes, each having an insulated holding portion and a pointed end that is forced into contact with an electrical conductor by an operator gripping the insulated portion. The spikes typically conduct current through flexible insulated wire leads attached to the ends of the spikes opposite the points. The leads are attached to the measurement device, typically a meter that senses the voltage drop between the two conductors in contact with the two spike points. Of the many other available probes, some take the shape of alligator clips, L-shaped clips, or hook-shaped clips.

Because a measurement with spike probes generally requires two hands, holding or adjusting the meter or holding another tool while simultaneously making a measurement, is almost impossible, particularly where the contacts are not easily accessible. Also, alligator clips and other clip-on probes are only capable of attachment to contacts that have features small enough to be gripped by the clips. Contacts such as the heads of countersunk or round, oval, or pan-head screws, for example, are extremely difficult to grip with clip-on probes. For such contacts, hand-held spike probes are used.

SUMMARY OF THE INVENTION

By interposing at least one magnet between the probe or the lead of a measurement device, and a contact at which the measurement of an electrical property is desired, the present invention overcomes most of the problems of typical probes. In one embodiment of the present invention, the inventor discloses a method and apparatus for making electrically conductive, nonmechanical connections with ferromagnetic contacts. Such connections facilitate the measurement and monitoring of current, voltage, power, impedance, resistance, and other electrical properties. The electrical connections of the present invention can also be used with circuit tracing devices such as the commonly understood Fox and Hound tracer. The electrical connections of the present invention can also be used as charging devices and jumpers.

DETAILED DESCRIPTION OF THE PREFERRED EMBODIMENT

Figure 1:
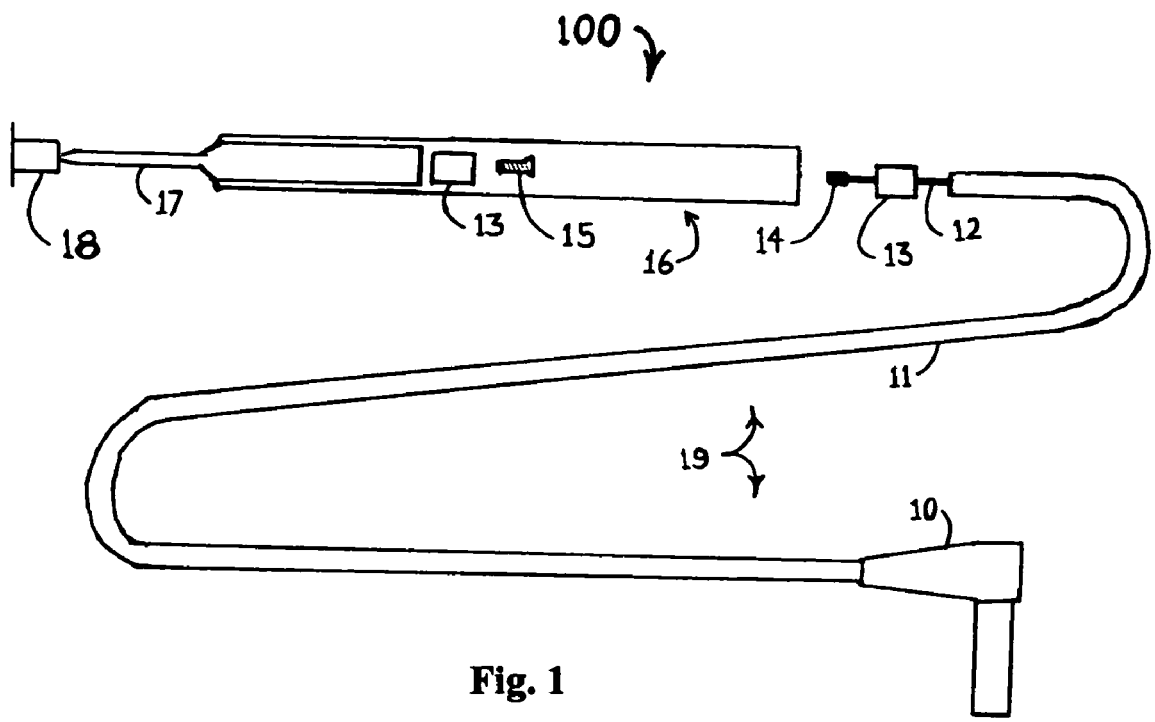
FIG. 1 is an exploded schematic of one embodiment of the present invention.

FIG. 1 is an exploded view of one embodiment of the present invention, spike probe 100 that consists of the probe housing 16 and the lead 19. When assembled, probe 100 conducts current from a magnetizable contact 18 to a meter (not shown) to which connector 10 is attached. An operator holds the nonconductive surface of probe housing 16 in or to which the electrically conducting tip 17 is embedded, molded, threaded, or otherwise attached. The operator presses tip 17 against contact 18, and current flows through tip 17, permanent magnet 13, the screw 15 that attaches magnet 13 to tip 17, and solder ball or wire crimp 14 on one end of lead cable 12. Lead cable 12 is insulated with conformal coating or sleeve 11. The end of lead cable 12 opposite the end attached to magnet 13 terminates in connector 10 that makes ultimate contact with a meter conductor (not shown). An identical probe can be used on a second contact, identical or similar to 18, to measure the voltage differential, impedance, resistance, or current between the two contacts.

The novel feature of the present invention that is illustrated in FIG. 1 is the electrically conducting, magnetic connection made between the two permanent magnets 13 inside the probe housing 16. That magnetic connection enables simultaneous and concurrent magnetic physical connectivity between contact 18 and tip 17 and electrical continuity between contact 18 and a conductor on a sampling device such as a meter that measures or monitors electrical or thermal properties.

Figure 2:
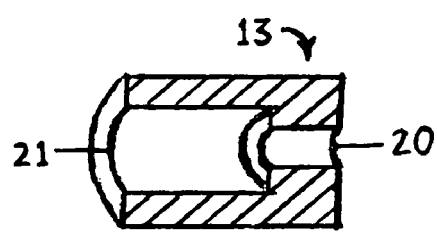
FIG. 2 is a cross sectional view of one embodiment of a permanent magnet used in one embodiment of the present invention.

FIG. 2 shows the internal construction of one embodiment of magnet 13 that permits attachment, with screw 15, of one magnet to a tapped hole in probe tip 17 and attachment, with solder, swaging, or press fit, of an identical or similar magnet 13 to one end 14 of lead cable 12. During assembly the end of cable 12 opposite connector 10 is led through the small diameter center hole 20 and into the larger diameter center hole 21 of a magnet 13. The cable end is then soldered, swaged, press fit, or otherwise tightly attached inside the cavity formed by center hole 21 so that it does not protrude from the hole 21 at the end of the magnet opposite hole 20. The lead insulation 11 is then snugged against the hole 20 end of magnet 13, and the connector 10 end of the lead made up for completion of lead 19.

The magnets can be any of the small rare-earth permanent magnets such as the neodymium iron boron or samarium cobalt magnets that can be sintered in various shapes and purchased from Magnetic Component Engineering, Inc. of Torrance, Calif. The two magnets are attached in orientations that assure that ends of opposite polarity contact each other when the magnet end of lead 19 is inserted into probe housing 16. The magnets of the present invention could also be electromagnets, which, while requiring power input, generally provide more holding power and longevity than permanent magnets.

The magnetic attachment feature illustrated in FIG. 1 permits probes of all types to be easily interchanged with the spike probe shown. Clips and other types of probes can be attached to lead 19 by detaching housing 16 and replacing it with housings holding various other types of probes and a properly oriented magnet. Clips, threaded tips, or other types of mechanical (nonmagnetic) lead attachments can augment the magnetic connection depicted in FIG. 1. Also, in monitoring two contacts, one or both of the probes can be magnetic.

The probe construction discussed above is one of many embodiments of the present invention that can be used where contact 18 is either magnetizable or nonmagnetizable. Where a contact is nonmagnetizable, a mechanical attachment type of tip or operator force is required to maintain continuity. Where a contact is magnetizable, the present invention's preferred embodiment dispenses with the need for probe housing 16 and probe tip 17 or other types of mechanical attachment such as clips. Electrical continuity required for measurements of electrical properties at a contact 18 can be established through the magnetic attachment to that contact of the magnet 13 that is integral to lead 19. For example, if the contact 18 of FIG. 1 were made of or coated with a ferrous material, an operator could attach lead 19 directly to it without the need for probe housing 16 or tip 17. In circumstances where direct attachment is made difficult by the flexible nature of lead 19, for example where the contact to be monitored is recessed in a deep receptacle, tube, or box, a loose spike probe can be used to hold and guide the magnet 13 into position on contact 18 and then removed. The same guidance could be achieved with the use of a lightweight straw slipped over the magnet end of a lead 19. The straw would add temporary stiffness to the lead sufficient for the user to guide the magnet into position on a deeply recessed contact.

Another embodiment of the present invention is an adapter constructed of a flexible or rigid connector that has a magnet attached on one end and an industry-standard male or female banana plug on the other end. With the adapter's magnet properly oriented, it could be attached to the magnet 13 on the end of the lead 19 of FIG. 1. The banana plug could then be used for connection of various contacts and probes that utilize the industry standard banana configuration. Adapters using other connector types such as BNC could be constructed within the scope of the present invention.

Figure 5:
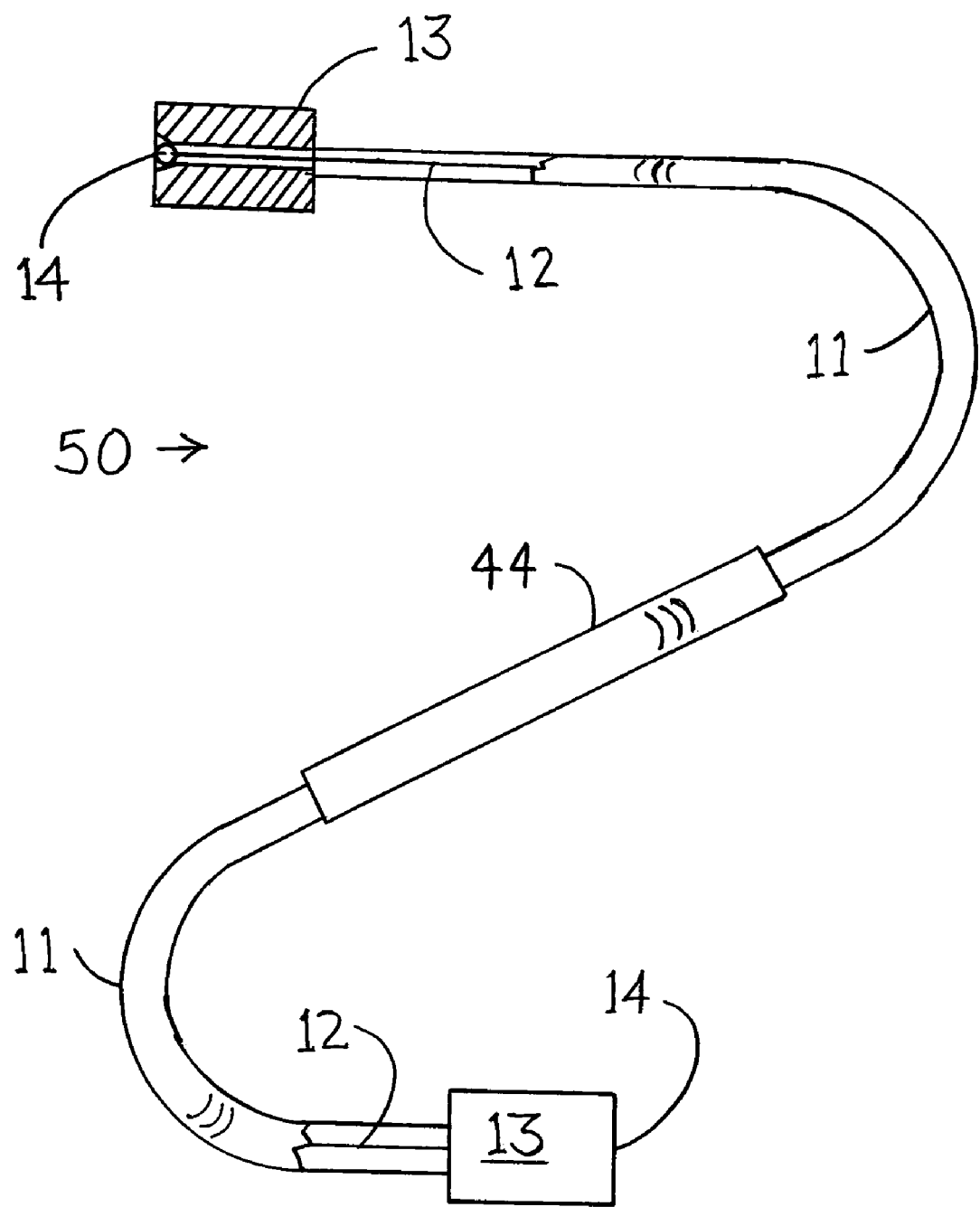
FIG. 5 is a partial cutaway, partial cross sectional view of an alternate embodiment of the present invention.

Another embodiment of the present invention is a conducting lead made of a wire having electrically conductive magnets attached to both ends. Such a device can be used for establishing electrical continuity between two contacts capable of being magnetized. Such a device is sometimes called a "jumper" or a "shunt." Where there is a need for joining multiple contacts into a common shunt, the present invention can take the form of a multi-armed jumper with an electrically conductive magnet at the end of each arm and all arms electrically joined. FIG. 5 shows one embodiment of the claimed jumper in which conductive magnets 13 are attached with solder balls 14 to the ends of conductive lead 12, which is covered with nonconductive insulation 11 and features a rigid tubular plastic housing 44 that is concentric with and can slide alone the insulation of lead 12.

Another embodiment of the present invention uses magnetic connections to charge devices such as capacitors and batteries.

In any of the embodiments of the present invention electrical continuity can be achieved by contact between two magnets, between one magnet and a conductive means of attachment of a second magnet, between the conductive means of attachment of two magnets, between one magnet and a conductive contact, or between the conductive means of attachment of one magnet and a conductive contact. For example, when probe housing 16 and lead 19 of FIG. 1 are joined to form probe 100, electrical continuity can be achieved with contact between the two magnets 13, or continuity can be achieved with contact between the conductive end 14 of lead cable 12 and the head of screw 15 or the magnet 13 attached to tip 17. Magnets 13 of FIG. 1 can therefore perform as part of an electrical circuit, or can perform as mere conductor holding means.

In the latter case, for breakdown protection of a magnet 13, or for minimization of extraneous measurement effects, it may be desirable to isolate the magnet or magnets 13 from the electrical circuit created between the measurement device and a contact being monitored. One embodiment of the present invention utilizes a nonconductive conformal coating dipped, sprayed, painted, electroplated, molded, or otherwise applied to part or all of the exterior surface of magnet 13. The coating is sufficiently thin such that the magnetic strength of magnet 13 is not significantly diminished.

Alternatively, if electrical isolation of magnet 13 is necessary, it can be achieved by mechanical design. For example, when probe housing 16 and lead 19 of FIG. 1 are joined to form probe 100, electrical continuity can be achieved with contact between the conductive end 14 of lead cable 12 and the head of screw 15 without involving magnets 13 in the circuit. Such isolation can be achieved by (1) proper design clearance or insulation between the threads of screw 15 and the inner diameter of an annular magnet 13, (2) a nonconductive washer between magnet 13 and the underside of the head of screw 15, (3) a nonconductive washer between magnet 13 and tip 17, (4) proper design clearance or insulation between the portion of cable 12 that penetrates annular magnet 13 and the inner diameter of an annular magnet 13, and (5) proper design clearance or insulation between magnet 13 and the cable end 14 that slightly protrudes from or is flush with the end of magnet 13 on lead 19.

For minimization of arcing that may occur between a contact and a magnetic probe when the probe is positioned in initial proximity to a contact, magnets 13 can be constructed in annular shapes fitted with centrally-mounted miniature spring-loaded needle probes that in their relaxed positions protrude slightly from the face of the magnet that is put into proximity with a contact to be monitored. In operation, such a needle probe is pushed against the contact, establishes electrical continuity with minimal arcing, and, when the magnet is fully seated on or around the contact, is pushed back into a position slightly protruding from or flush with the face of the magnet adjacent to the contact. In the event of minute debris particles on the face of a magnet or a contact, the needle probe of such a configuration will provide the best possible electrical contact.

Some magnets may add resistance, or, in the case of an electromagnet, inductance, to an electrical circuit. Any such effects can be predicted or measured, and can be calibrated out of a measurement. Alternatively, such effects can be negated with the use of fixed or adjustable current, resistance, or voltage offsets built into the measuring device.

One embodiment of the present invention includes means for attachment of magnets 13 such that the magnets are replaceable in the field. Such convenience can be realized with, for example, the use of screws 15 instead of solder or crimp joints 14.

In various embodiments of the present invention where mating magnets are used, for example the lead 19 and probe housing 16 of probe 100, the two magnets in one model, say the red model, can be installed so that the North polarity end of one particular magnet, say magnet 13 in probe housing 16, faces the South polarity end of the other magnet, say magnet 13 in the lead 19. The two magnets in another model, say the black model, can be installed with polarities arranged opposite from those of the red model. Such a construction would prevent a red lead 19 from being mated with a black probe housing 16, and vice versa.

One embodiment of the present invention enables power leads or charging devices to be attached to terminals without the necessity for mechanical connections.

Figure 3:
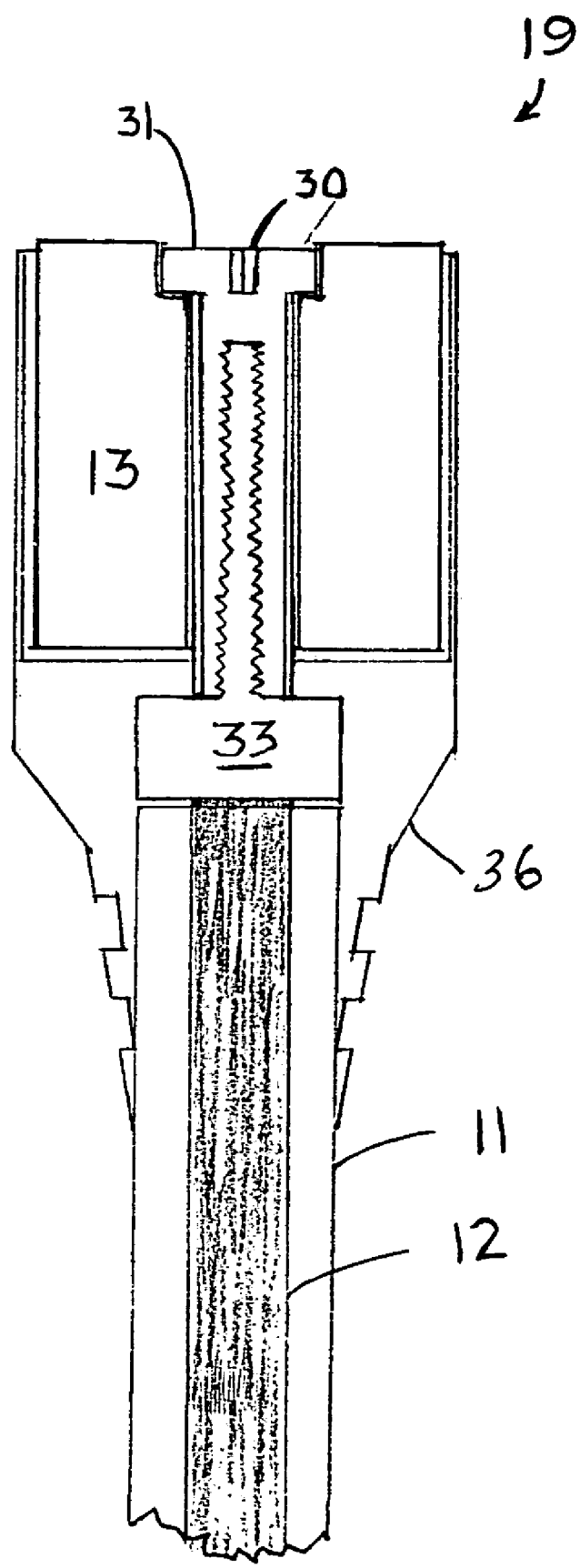
FIG. 3 is a cross sectional view of an alternate embodiment of the attachment of a permanent magnet to a lead cable.

FIG. 3 shows one method of attachment of magnet 13 to one end of a lead 19. Annular magnet 13 is fixed to an end of lead 19 by threading female threaded post 31 onto male threaded post 33 that is crimped, soldered, or otherwise conductively attached to conductive wire lead 12 coated with insulation 11. Post 31 is tightened with drive socket or slot 30.

Figure 4:
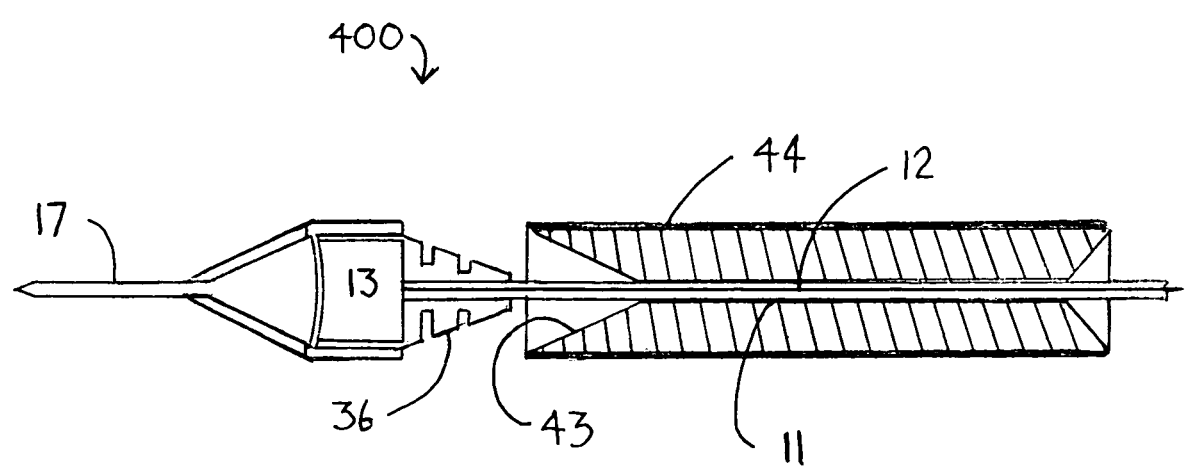
FIG. 4 is a cross sectional view of an alternate embodiment of the present invention.

FIG. 4 shows an alternate embodiment 400 of the present invention. Permanent magnet 13, attached to wire lead 12 coated with insulation 11 is made integral with flexible stress relief feature 36 in a molding or press fit process. The concave front face of magnet 13 seats with magnetic force onto the convex rear face of magnetizable tip 17. Tubular housing 44 slides along lead insulation 11 and is capable of a snug fit between its funnel-shaped front end and the mating funnel-shaped stress relief feature 36. The snug fit enables an operator to use housing 44 as a guide or handle to position tip 17 on a contact from which a measurement is desired. When magnetic contact is made, the operator can pull housing 44 away from stress relief feature 36 and slide it away from the contact and tip area. This prevents the weight of the housing from imposing a torque on tip 17 that could force it off of the contact.

It will be apparent to those with ordinary skill in the relevant art having the benefit of this disclosure that the present invention provides a method and apparatus for achieving electrical continuity. It is understood that the forms of the invention shown and described in the detailed description and the drawings are to be taken merely as presently preferred examples and that the invention is limited only by the language of the claims. While the present invention has been described in terms of one preferred embodiment and various variations thereof, it will be apparent to those skilled in the art that form and detail modifications may be made to those embodiments without departing from the spirit or scope of the invention.

I claim:

1. A method of establishing electrical continuity between a magnetizable, electrically conductive first contact and a probe having a first and a second end, said method comprising bringing said first end of said probe sufficiently proximate to said first contact so that a magnetic force establishes physical connection between said first end of said probe and said first contact, wherein said magnetic force is generated at or near said first end of said probe, and wherein said probe is as least partially comprised of one or more permanent, electrically conductive magnets capable of generating said magnetic force.

2. The method of claim 1 wherein said second end of said probe is attached to a device for sampling electrical properties.

3. The method of claim 1 wherein said second end of said probe is attached to a device for sampling thermal properties.

4. The method of claim 1 wherein said second end of said probe is attached to a device for charging an electrical storage device.

5. The method of claim 1 wherein said second end of said probe is a substantial mirror image of said first end of said probe.

6. The method of claim 1 further including a mechanical attachment for augmenting said physical connection between said first end of said probe and said first contact.

7. The method of claim 6 wherein said first contact is nonmagnetizable.

8. A probe comprising:
   an electrically insulated wire lead having first and second ends, said first end of said wire lead terminated with a first electrically conductive permanent magnet, and said second end of said wire lead capable of termination with an electrical connector capable of connection to an electrical device;
   a non-conducting probe housing having first and second ends, said second end of said probe housing capable of receiving said first permanent magnet and said first end of said wire lead;
   an electrically conducting tip having first and second ends, said second end of said tip capable of being received by said first end of said probe housing; and
   a second electrically conductive permanent magnet capable of removeable attachment to said second end of said tip so that when said first permanent magnet termination of said first end of said wire lead is received by said second end of said probe housing, said first and second permanent magnets are capable of being attracted to each other.

9. A probe as in claim 8 wherein said second end of said tip is capable of magnetically attracting and receiving said first permanent magnet in the absence of said second permanent magnet.

10. A probe as in claim 9 wherein said first permanent magnet is attached to said first end of said wire lead with a feature capable of relieving strain imposed on said wire lead.

11. A probe as in claim 10 wherein a stiff, non-conducting probe housing is approximately concentrically mounted on said wire lead and is capable of sliding movement along said wire lead.

12. A probe as in claim 11 wherein one end of said probe housing is capable of removeable attachment to said strain relief feature on said wire lead.

13. A probe comprising an electrically insulated wire lead having first and second ends terminated with a first and second electrically conductive permanent, respectively; and one or more stiff noncondutive tubular housings slideably atttached to said wire lead.

14. A probe as in claim 13 wherein said housing is not slidebale.

* * * * *